(12) United States Patent
Cao et al.

(10) Patent No.: US 10,386,726 B2
(45) Date of Patent: Aug. 20, 2019

(54) GEOMETRY VECTORIZATION FOR MASK PROCESS CORRECTION

(71) Applicant: GLOBALFOUNDRIES INC., Grand Cayman (KY)

(72) Inventors: Liang Cao, Clifton Park, NY (US); Wenchao Jiang, Ballston Spa, NY (US); Guoxiang Ning, Clifton Park, NY (US); Jie Zhang, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 97 days.

(21) Appl. No.: 15/720,182

(22) Filed: Sep. 29, 2017

(65) Prior Publication Data

US 2019/0101834 A1    Apr. 4, 2019

(51) Int. Cl.
*G03F 7/20* (2006.01)
*G05B 13/04* (2006.01)

(52) U.S. Cl.
CPC .......... *G03F 7/70441* (2013.01); *G03F 7/704* (2013.01); *G05B 13/042* (2013.01); *G05B 13/048* (2013.01)

(58) Field of Classification Search
USPC .......................................................... 716/53
See application file for complete search history.

(56) References Cited

U.S. PATENT DOCUMENTS

| 7,376,922 | B2 | 5/2008 | Rushing et al. | |
|---|---|---|---|---|
| 8,402,397 | B2 | 3/2013 | Robles et al. | |
| 8,464,194 | B1 | 6/2013 | Kgarwal et al. | |
| 9,043,738 | B2 | 5/2015 | Ward | |
| 2005/0095509 | A1* | 5/2005 | Zhang | G03F 1/84 430/5 |
| 2005/0204328 | A1* | 9/2005 | Strelkova | G03F 1/36 716/52 |
| 2007/0061773 | A1* | 3/2007 | Ye | G03F 7/70441 716/52 |
| 2018/0096094 | A1* | 4/2018 | Huang | G06F 17/5081 |

FOREIGN PATENT DOCUMENTS

WO    2016096309 A1    6/2016

* cited by examiner

*Primary Examiner* — Bryce M Aisaka
(74) *Attorney, Agent, or Firm* — Anthony Canale; Hoffman Warnick LLC

(57) ABSTRACT

Various aspects include vectorization approaches for model-based mask proximity correction (MPC). In some cases, a computer-implemented method includes: assigning a set of vectors to geometry data describing at least one mask for forming an integrated circuit (IC); adjusting a statistical predictive model of the at least one mask based upon the set of vectors and the geometry data; predicting an adjustment to the at least one mask with the statistical predictive model; and adjusting instructions for forming the at least one mask in response to a predicted mask result of the statistical predictive model deviating from a target mask result for the at least one mask.

17 Claims, 11 Drawing Sheets

GEOMETRY VECTORIZATION FOR MASK PROCESS CORRECTION

BACKGROUND

Technical Field

The present disclosure relates to integrated circuits (ICs). More specifically, the present disclosure relates to processes for designing and manufacturing ICs.

Related Art

Fabrication foundries ("fabs") can manufacture ICs using photolithographic processes. Photolithography is an optical printing and fabrication process by which patterns on a photolithographic mask (i.e., photomask) are imaged and defined onto a photosensitive layer coating of a substrate. To manufacture an IC, photomasks are created using an IC layout as a template. The photomasks contain the various geometries of the IC layout, and these geometries can be separated with layers of photoresist material. The various geometries contained on the photomasks correspond to the various base physical IC elements that make up functional circuit components such as transistors, interconnect wiring, via pads, as well as other elements that are not functional circuit elements but are used to facilitate, enhance, or track various manufacturing processes. Through sequential use of the various photomasks corresponding to a given IC in an IC fabrication process, a large number of material layers of various shapes and thicknesses with different conductive and insulating properties may be built up to form the overall IC and the circuits within the IC layout.

As integrated circuit (IC) components have continued to decrease in size, improvements to scale have spawned design implementation issues for some types of geometries, e.g., in complementary metal-oxide-semiconductor (CMOS) ICs with geometries sized less than approximately twenty-two nanometers (nm). As IC technology continues to shrink, the growing need for empirical data from ever-complex designs complicates the manufacturing process, thereby increasing the risk of defects or impaired operability. Conventional approaches for traversing physical limits may apply manual or computer-implemented techniques for increasing the resolution of chips printed using optical lithography. One such technique is known as optical proximity correction (OPC). OPC is a computational method for correcting irregularities and distortions arising from diffraction effects by the transforming of mask geometries into corrected shapes.

Although OPC has proven effective for accounting for diffraction effects during integrated IC manufacture, some OPC tools may not fully account for manufacturing variations caused by further reductions in the size of a product and its various components. To enhance the effectiveness of OPC techniques, a circuit fabricator may apply one or more optical rule checking (ORC) simulations for identifying portions of a circuit with significant amounts of manufacturing sensitivity. An ORC simulation may allow manufacturers to simulate IC fabrication under multiple process variants (e.g., light intensity, image contrast at edges, etc.) to identify portions of an IC structure which may be sensitive to manufacturing variations.

In addition to rule-based techniques such as traditional OPC and ORC, model-based processes can also be used to account for manufacturing variations in ICs. In these model-based approaches, such as model-based OPC or model-based mask proximity correction (MPC) (performed after OPC process), a physical model of the manufactured masks and/or fabrication processes is derived, simulations are performed according to expected conditions, and the model is updated based upon the simulations. While these physical-model-based approaches can be more accurate than rules-based approaches (e.g., due to the ability to perform real-time simulation and adjustment to the physical model), in practice, these approaches often require several iterations of simulation and modification in order to ensure accuracy. Each iteration can be time-consuming, costly, and require significant processing resources.

SUMMARY

A first aspect of the disclosure provides a computer-implemented method including: assigning a set of vectors to geometry data describing at least one mask for forming an integrated circuit (IC); adjusting a statistical predictive model of the at least one mask based upon the set of vectors and the geometry data; predicting an adjustment to the at least one mask with the statistical predictive model; and adjusting instructions for forming the at least one mask in response to a predicted mask result of the statistical predictive model deviating from a target mask result for the at least one mask.

A second aspect of the disclosure provides a computer program product having program code stored on a computer readable storage medium, which when executed by at least one computing device, causes the at least one computing device to perform actions including: assigning a set of vectors to geometry data describing at least one mask for forming an integrated circuit (IC); adjusting a statistical predictive model of the at least one mask based upon the set of vectors and the geometry data; predicting an adjustment to the at least one mask with the statistical predictive model; and adjusting instructions for forming the at least one mask in response to a predicted mask result of the statistical predictive model deviating from a target mask result for the at least one mask.

A third aspect of the present disclosure provides a system having: at least one computing device configured to perform actions including: assigning a set of vectors to geometry data describing at least one mask for forming an integrated circuit (IC); adjusting a statistical predictive model of the at least one mask based upon the set of vectors and the geometry data; predicting an adjustment to the at least one mask with the statistical predictive model; and adjusting instructions for forming the at least one mask in response to a predicted mask result of the statistical predictive model deviating from a target mask result for the at least one mask.

Figure 1:
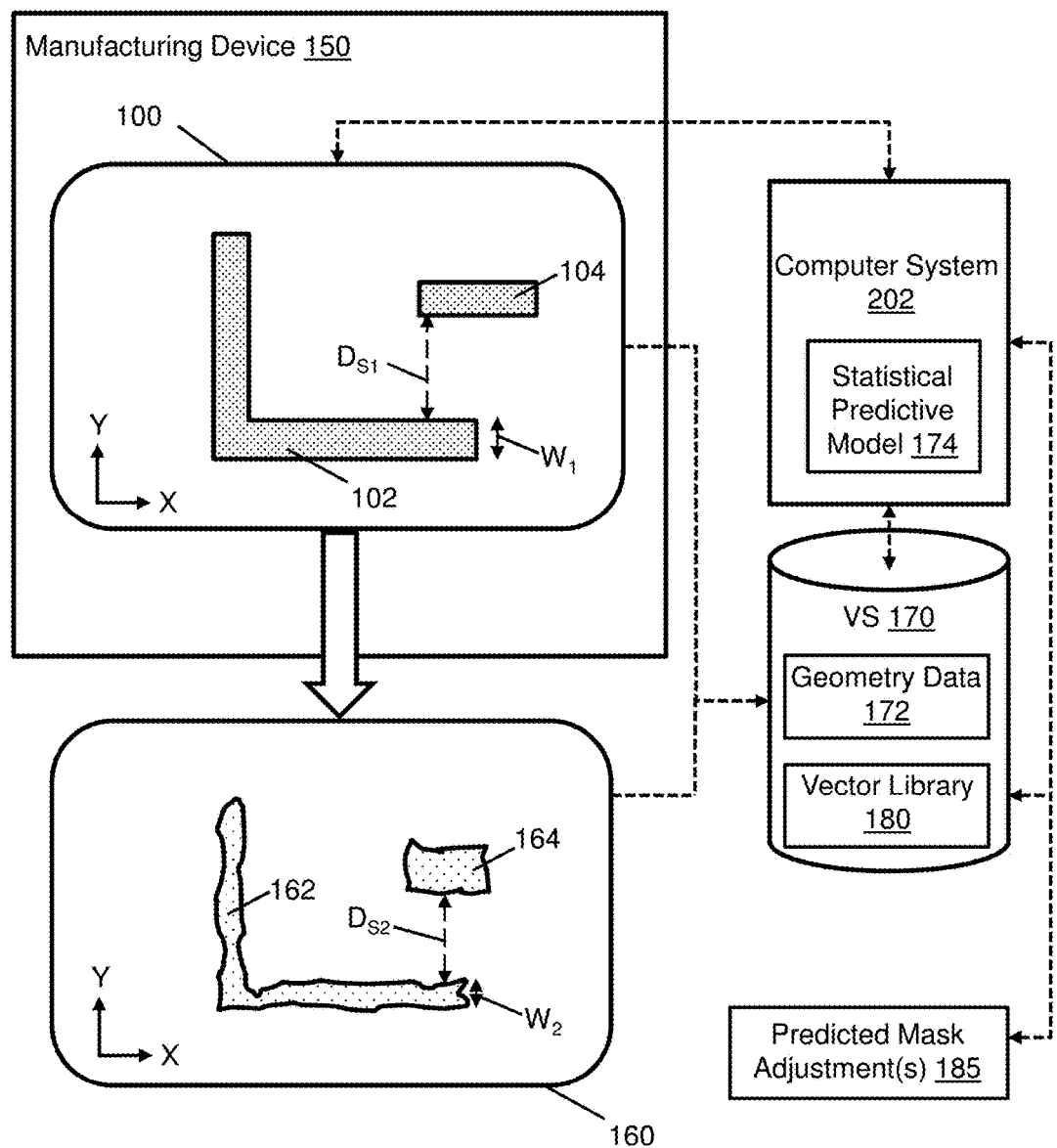
FIG. 1 provides a schematic data flow diagram of components and processes for modeling a circuit from an IC layout with mask process correction (MPC) models according to embodiments of the disclosure.

It is noted that the drawings of the disclosure are not necessarily to scale. The drawings are intended to depict only typical aspects of the invention, and therefore should not be considered as limiting the scope of the invention. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

As noted herein, current physical model-based mask process correction (MPC) can require several iterations of simulation and modification in order to ensure accuracy. Each iteration can be time-consuming, costly, and require significant processing resources.

In contrast to conventional approaches, various aspects of the disclosure include approaches for statistically modeling mask process correction (MPC) and edge adjustment (or, edge correction). In particular embodiments, a vectorization system assigns vectors to geometry data describing one or more masks used to form an IC. The geometry data can describe edges of the mask(s) as well as expected edges of the shapes formed from those masks. This vectorized geometry data is used to update (and in some cases, build at least a portion of) a statistical predictive model of the mask(s). After updating the statistical predictive model, that statistical predictive model is used to predict the correct mask shapes for manufacturing a target mask result. In particular implementations, prediction using the statistical predictive model is only performed one time for a given mask or set of masks. After the prediction has been performed, the predicted adjustment used to form the mask(s) (mask instructions) can be updated to account for deviations between the predicted mask results and target mask results.

Introduction and General Definitions

Embodiments of the disclosure can use machine-learning techniques for modeling mask geometries and adjusting mask process correction (MPC) approaches in forming integrated circuits (ICs), as well as adjusting the simulations and reference data for such models. Embodiments of the disclosure include systems, computer program products and methods employing a vectorization system to model MPC in IC layouts.

To better illustrate the various embodiments of the present disclosure, particular terminology which may be known or unknown to those of ordinary skill in the art is defined to further clarify the embodiments set forth herein. The term "system" can refer to a computer system, server, etc., composed wholly or partially of hardware and/or software components, one or more instances of a system embodied in software and accessible to a local or remote user, all or part of one or more systems in a cloud computing environment, one or more physical and/or virtual machines accessed via the Internet, other types of physical or virtual computing devices, and/or components thereof.

The term "IC layout" can refer to a digital rendering or similar representation of a complete or partial IC chip which includes a plurality of circuit geometries which may be stored, e.g., in a memory component of a computer system. A "region" refers to any subset of a given IC layout. A "pattern" refers to a representation of one or more elements in an IC layout, which may be transferred from the memory of a computer system onto a mask by way of, for example, direct-write electron beam lithography. Optical proximity correction (or "OPC") generally refers to a process by which an IC layout is simulated for printing by converting a set of ideal patterns into corrected shapes to account for one or more printing errors. Mask process correction (or "MPC") generally refers to a process by which mask shapes used to form an IC layout are simulated for lithography processes by converting a set of ideal mask patterns into corrected mask patterns to account for one or more lithography errors. MPC builds upon the corrections made in OPC, as these processes affect one another. A "geometry" or "pattern geometry" refers to an estimated printing region of a given pattern in an OPC simulation or MPC simulation.

FIG. 1 provides schematic a schematic data flow diagram of components and processes for computer-aided circuit design and analysis according to embodiments of the disclosure. FIG. 1 illustrates a proposed IC layout 100 indicative of at least a portion, in plane X-Y, of a product to be simulated and manufactured using optical proximity correction (OPC) and mask process correction (MPC). Proposed IC layout 100 can include patterns 102, 104 to be printed at respective positions. Although two patterns 102, 104 are shown in proposed IC layout 100 for the purposes of demonstration only, it is understood that proposed IC layout 100 of FIG. 1 can represent only a portion of a larger IC layout to be printed. More specifically, proposed IC layout 100 depicted in FIG. 1 can represent a single region of proposed IC layout 100. Each region of proposed IC layout 100 may include multiple patterns 102, 104 which are in close physical proximity relative to other patterns, and/or may be functionally interrelated or designed to be manufactured together. In some cases, proposed IC layout 100 may include only a select group of regions and associated patterns 102, 104 which may provide a group of empirical data for OPC modeling and/or MPC modeling. Each pattern 102, 104 in proposed IC layout 100 can include corresponding widths in plane X-Y, e.g., $W_1$ of pattern 102. Patterns 102, 104 can be spaced apart, e.g., by a respective separation distance $D_{S1}$ along a corresponding axis (shown along Y-axis for the sake of example).

A manufacturing device 150 (e.g., a single manufacturing plant and/or a group of interconnected devices for producing a manufactured circuit 160 from a proposed layout) can be operable to receive proposed IC layout 100 and yield manufactured circuit 160 based on proposed IC layout 100. Manufactured circuit 160 can include one or more printed patterns 162, 164 formed based on, e.g., pattern(s) 102, 104 of proposed IC layout 100. Manufacturing device 150 can be operable to, e.g., cause manufacture of one or more printed patterns 162, 164 at positions designated with patterns 102, 104 in proposed IC layout 100. As shown, printed patterns 162, 164 can vary in size, shape, etc., from their corresponding patterns 102, 104 in proposed IC layout 100. Structural differences between patterns 102, 104 and printed patterns 162, 164 may be caused by processing variants, e.g., differences in light intensity, the position and operation of various components in manufacturing device 150, proximity effects from other patterns in proposed IC layout 100, defects in the shape of masks used to perform lithography processes in forming printed patterns 162, 164, etc. Printed patterns 162, 164 can also have, e.g., an X-Y width $W_2$ and separation distance $D_{S2}$, e.g., along Y-axis which may be similar to or different from separation distance $D_{S1}$ and/or width $W_1$ in proposed IC layout 100.

Systems according to the disclosure can include a vectorization system (VS) 170 including geometry data 172 corresponding to various IC layouts 100, modeled circuits and/or manufactured circuits 160, and which may include representations of patterns 102, 104 and/or printed patterns 162, 164 in geometric form (e.g., in coordinate form). In accordance with embodiments of the disclosure, VS 170 is connected to, and modified by a statistical predictive model 174 including, e.g., one or more machine learning algorithms therein. Statistical predictive model 174 can be housed, e.g., in a computer system 202, and the various machine learning algorithms therein can be trained by way of processing techniques described herein. Computer system 202 can be in communication with VS 170, e.g., according to any currently-known or later developed solution for communicating between data repositories (e.g., VS 170), computer systems (e.g., computer system 202), and/or other data repositories discussed herein.

As described further herein, vector library 180 can be generated by vectorization system 170 (FIG. 1), and upon being generated, can be stored locally in VS 170 and/or transmitted to an external store (e.g., storage system 214). As described elsewhere herein, embodiments of the disclosure can allow computer system 202 (FIG. 1) to generate vector libraries 180 which more accurately capture the properties of proposed IC layout 100 and manufactured circuits 160 (or modeled/simulated versions thereof) (FIG. 1) created from proposed IC layout 100 (FIG. 1). In some particular embodiments, vector libraries 180 can provide a vectorized representation of geometry data 172 to account for potential mask process variations in forming manufactured circuit 160 according to proposed IC layout 100. Proposed IC layout 100 can represent an entire product, with each pattern 102, 104 to be manufactured included therein. However, in other cases, proposed IC layout 100 can represent only a portion of a circuit to be manufactured. Vector library 180 may include single-layer vectors such as two-dimensional vectors, or can include multiple-layer vectors for a particular layout, e.g., depicting vectorized features of geometry data 172 in a different two-dimensional plane and/or in three-dimensional space.

Using Predictive Model to Predict Mask Deviations in IC Layout

Figure 2:
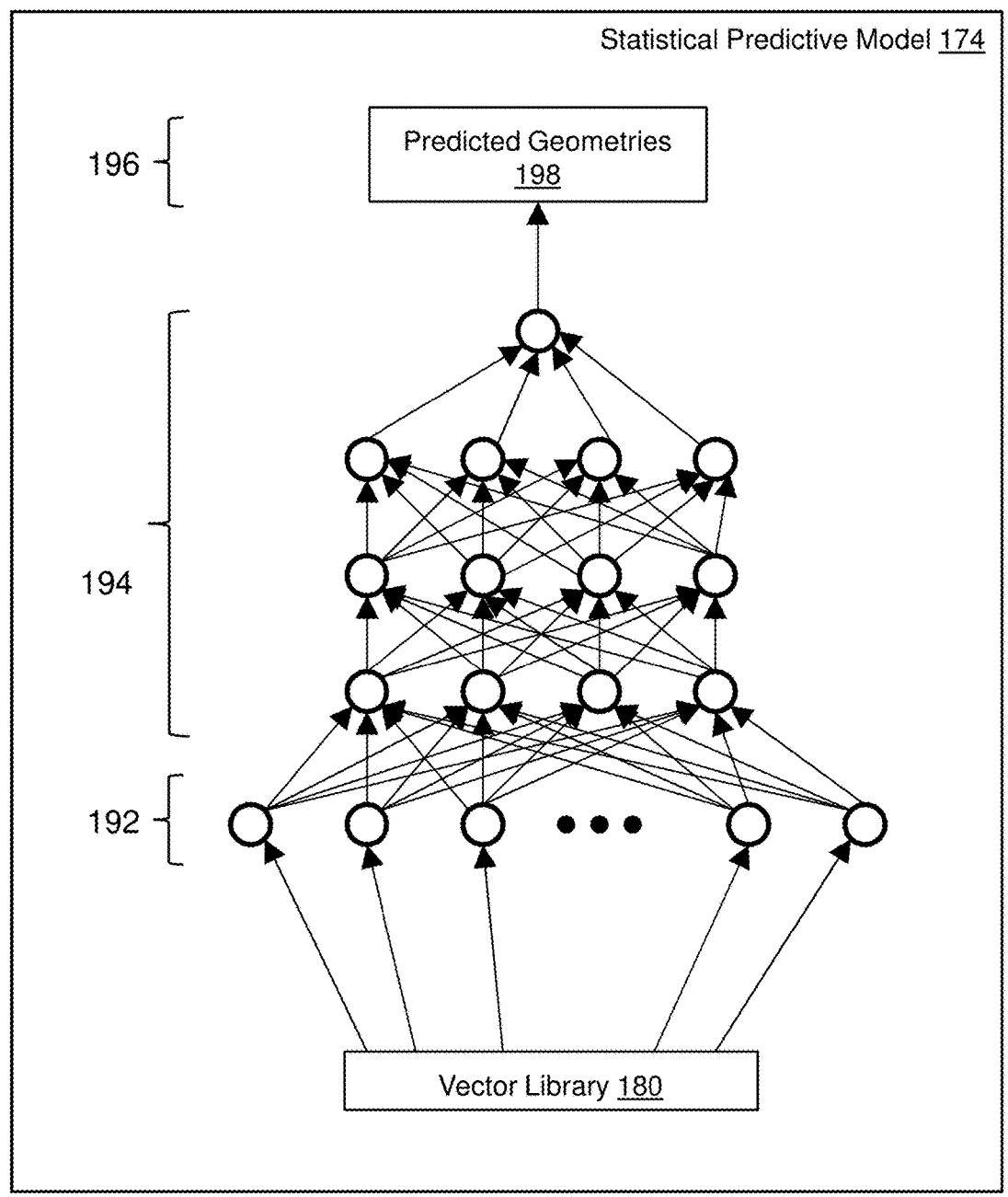
FIG. 2 provides a schematic process diagram illustrating a method of using an artificial neural network (ANN) to predict process-sensitive geometries in an IC layout according to embodiments of the disclosure.

Turning to FIG. 2, a schematic diagram illustrating statistical predictive model 174 is shown to further illustrate processes for predicting vector adjustments in proposed IC layout 100 according to the disclosure. Statistical predictive model 174 can relate one or more input variables (e.g., vector library 180) to predictions of whether various patterns 102, 104 of proposed IC layout 100 corresponding with vector library 180 will include one or more violations. As vector libraries 180 are submitted to statistical predictive model 174, algorithms included in statistical predictive model 174 can be iteratively adjusted based on comparing various outputs (e.g., predictions for patterns 102, 104 in proposed IC layout 100) to verified, ideal values and/or other related groups of inputs and outputs (e.g., printed patterns 162, 164 of manufactured circuit(s) 160 or predicted mask adjustments 185). Inputs 192 denote a group of inputs provided to statistical predictive model 174 which can include the vector library 180 produced with VS 170. Inputs 192 can together define an input layer of statistical predictive model 174 represented by multiple nodes. Each node and respective input 192 can in turn be connected to other nodes in a hidden layer 194, which represent particular mathematical functions. In embodiments of the present disclosure, inputs 192 can include, e.g., the vector libraries 180 including mask adjustment vectors corresponding to patterns 102, 104 included in proposed IC layout 100 and/or other IC layouts. Each node of hidden layer 194 can include a corresponding weight representing a factor or other mathematical adjustment for converting input variables into output variables. The nodes of hidden layer 194 can eventually connect to at least one output node 196 from statistical predictive model 174, which predicts the presence of violations (e.g., mask deviations) in IC layout 100 based on inputs 192. In embodiments of the disclosure, output 196 from statistical predictive model 174 can include determining whether a particular region is mask process sensitive, e.g., may be classified as a mask deviation region based on inputs 192.

In some particular embodiments, to increase the effectiveness of its predictions, statistical predictive model 174 can compare outputs 196 with predetermined or target (e.g., ideal) values, e.g., from predicted mask adjustment(s) 185 or manufactured circuit(s) 160, to calculate errors in a process known as "error backpropagation." Such errors may include, e.g., geometries (including direction and magnitude) of vectors in vector library 180 being improperly classified as being a mask deviation or not being a mask deviation. For example, process steps encoded in hardware and/or software can use outputs 196 to adjust weights of hidden layer 194 and or connections between inputs 192 and hidden layer 194. In an example embodiment, error backpropagation can include "Bayesian Regulation," a series of mathematical steps leveraging probability for weight calculations in order to minimize the mean squared error (MSE) (i.e., the squared value of the difference between an output and a predetermined value, whether positive or negative) between values of output(s) 196 and the predetermined values. Bayesian Regulation can help generalize the various mathematical models in statistical predictive model 174 to avoid over fitting experimental data to a particular situation. Thus, statistical predictive model 174 can develop and adjust underlying algorithms, equations, connections, sub-models, etc., therein by processing multiple inputs 192 to calculate outputs 196 and compare outputs 196 to predetermined or expected values.

Statistical predictive model 174 can take the form of an artificial neural network (ANN), and more specifically can include one or more sub-classifications of ANN architectures, whether currently-known or later developed. In one example, statistical predictive model 174 can take the form of a "convolutional neural network," for predicting mask deviations (e.g., through predicted geometries 198) from base images (e.g., patterns 102, 104 in proposed IC layout 100, and/or vector libraries 180). Convolutional neural networks may be distinguished from other neural network models, e.g., by including individual nodes in each layer which respond to inputs in a restricted region of a simulated space known as "a receptive field." The receptive fields of different nodes and/or layers can partially overlap such that they together form a tiled depiction of a visual field (e.g., vector libraries 180 in two-dimensional space). The response of an individual node to inputs within its receptive field can be approximated mathematically by a convolution operation. In another example, statistical predictive model 174 can take the form of a multilayer perceptron (MLP) neural network. MLP neural networks may be distinguished from other neural networks, e.g., by mapping sets of input data onto corresponding sets of outputs by way of a directed graph. MLP neural networks can rely upon automatic supervised learning, e.g., through one or more backpropagation processes described herein. MLP neural networks may be particularly suitable for sets of data which may not be linearly separable by conventional mathematical techniques. Regardless of the chosen architecture of statistical predictive model 174, the various processes for training statistical predictive model 174 and/or expanding the information included in VS 170 implemented with embodiments of the present disclosure can be similar or identical.

Computer System and Example Components

Figure 3:
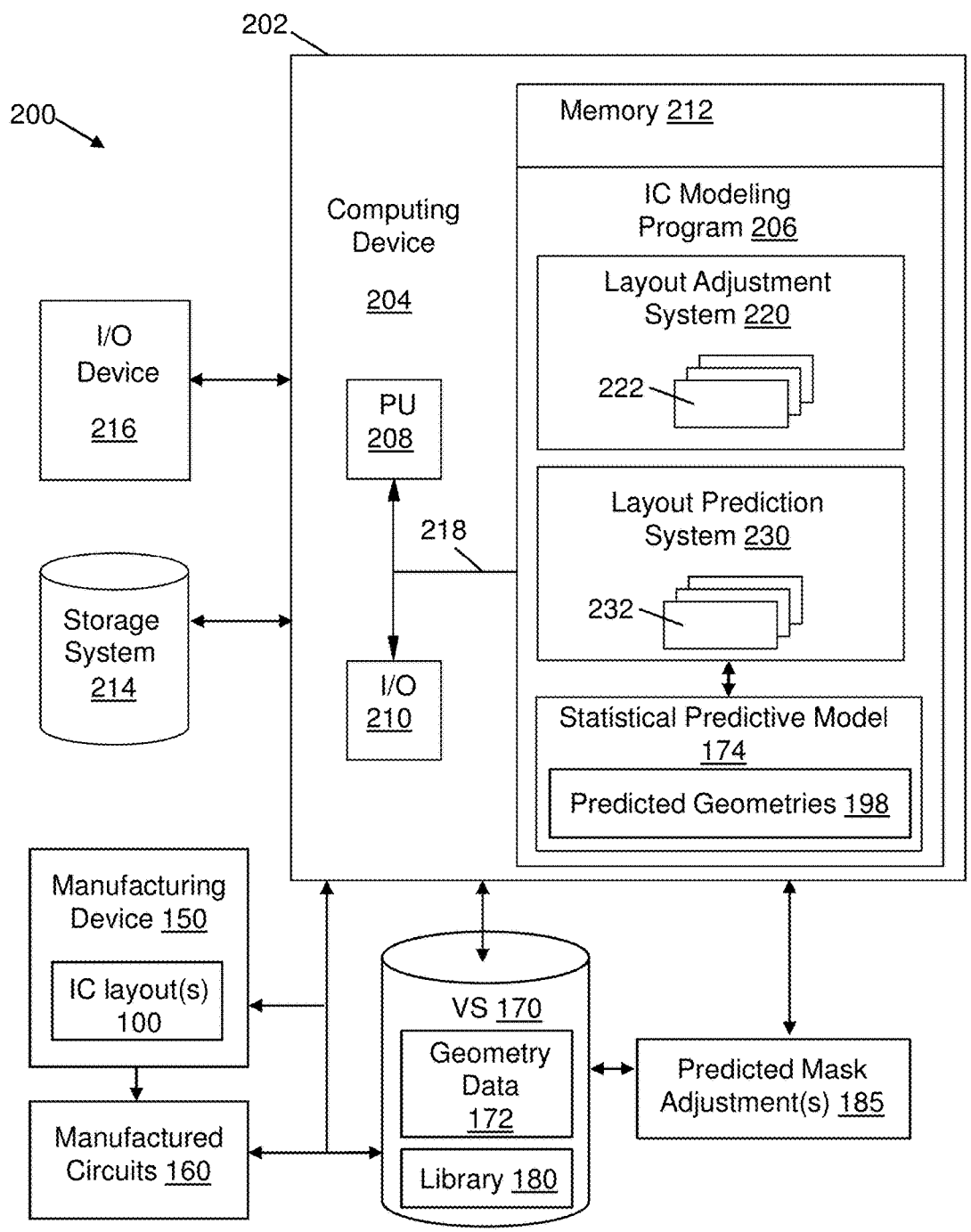
FIG. 3 depicts an illustrative environment including a computer system configured to interact with a vectorization system, and an MPC simulator to modify mask characteristics in an IC layout according to embodiments of the disclosure.

Turning now to FIG. 3 an illustrative environment 200 for implementing the methods and/or systems described herein is shown. In particular, a computer system 202 is shown as including a computing device 204. Computing device 204 can include, e.g., an IC modeling program 206 which may include, e.g., one or more sub-systems (layout adjustment system 220 and/or layout prediction system 230 described herein) for performing any/all of the processes described herein and implementing any/all of the embodiments described herein.

Computer system 202 is shown including a processing unit (PU) 208 (e.g., one or more processors), an I/O component 210, a memory 212 (e.g., a storage hierarchy), an external storage system 214, an input/output (I/O) device 216 (e.g., one or more I/O interfaces and/or devices), and a communications pathway 218. In general, processing unit 208 can execute program code, such as IC modeling program 206, which is at least partially fixed in memory 212. While executing program code, processing unit 208 can process data, which can result in reading and/or writing data from/to memory 212 and/or storage system 214. Pathway 218 provides a communications link between each of the components in environment 200. I/O component 210 can comprise one or more human I/O devices, which enable a human user to interact with computer system 202 and/or one or more communications devices to enable a system user to communicate with the computer system 202 using any type of communications link. To this extent, IC modeling program 206 can manage a set of interfaces (e.g., graphical user interface(s), application program interface(s), etc.) that enable system users to interact with IC modeling program 206. Further, IC modeling program 206 can manage (e.g., store, retrieve, create, manipulate, organize, present, etc.) data, through several modules contained within a layout adjustment system 220 (i.e., modules 222) and/or a layout prediction system 230 (i.e., modules 232). Layout adjustment system 220 and layout prediction system 230 are shown by example as being sub-systems of IC modeling program 206. However, it is understood that layout adjustment system 220 and layout prediction system 230 may be wholly independent systems. Memory 212 of computing device 204 is also shown to include statistical predictive model 174, though it is understood that statistical predictive model 174 may be included within one or more independent computing devices, programs, etc., in alternative embodiments.

As noted herein, IC modeling program 206 can include layout adjustment system 220 and layout prediction system 230. In this case, various modules 222 of layout adjustment system 220 and modules 232 of layout prediction system 230 can enable computer system 202 to perform a set of tasks used by IC modeling program 206, and can be separately developed and/or implemented apart from other portions of IC modeling program 206. Memory 212 can thus include various software modules 222, 232 of systems 220, 230, respectively, configured to perform different actions. Example modules can include, e.g., a comparator, a calculator, a determinator, etc. One or more modules 222, 232 can use algorithm-based calculations, look up tables, software code, and/or similar tools stored in memory 212 for processing, analyzing, and operating on data to perform their respective functions. Each module discussed herein can obtain and/or operate on data from exterior components, units, systems, etc., or from memory 212 of computing device 204.

Sets of modules 222, 232 of layout adjustment system 220 and layout prediction system 230 are shown to illustrate operation of computer system 202 according to various examples. Layout adjustment system 220 can include, e.g., modules 222 for building and modifying IC layouts 100 provided to manufacturing device 150 to produce manufactured circuits 160. In addition or as an alternative to proposed IC layout 100, layout adjustment system 220 can generate a database expressed, e.g., through a list, graphical representation, and/or other organizational structure of each pattern 102 (FIG. 1), in proposed IC layout(s) 102. Layout adjustment system 220 can construct and/or modify various components simulated in proposed IC layout 100 and/or related data 172. In addition, layout adjustment system 220 can quantify one or more metrics for each pattern (e.g., length, width, surface area, printability, etc.) in proposed IC layout 100 and/or related data 172. In further embodiments, layout adjustment system 220 can produce various outputs (e.g., newly constructed or adjusted form of proposed IC layouts 100) based on predictions by layout prediction system 230, related data 172, ORC libraries 180, etc. Such inputs can be provided to computing device 204, e.g., through I/O device 216. Some attributes of proposed IC layout 100 can be converted into a data representation (e.g., a data matrix with several values corresponding to particular attributes) and stored electronically, e.g., within memory 212 of computing device 204, storage system 214, and/or any other type of data cache in communication with computing device 204. Images and/or other representations of proposed IC layout 100, predicted mask adjustment(s) 185, manufactured circuit 160, etc., can additionally or alternatively be converted into data inputs or other inputs to IC modeling program 206 with various scanning or extracting devices, connections to independent systems, and/or manual entry of a user. As an example a user of computing device 204 can submit vector libraries 180, constructed from proposed IC layout 100 to layout prediction system 230. In some cases, manufacturing device 150 (e.g., as a result of instructions by IC modeling program 206), can create manufactured circuit(s) 160 from proposed IC layout 100, or can create a predicted circuit (e.g., including predicted mask adjustments 185 in masks used to form the IC layout, as a result of instructions by IC modeling program 206). VS 170 and/or IC modeling program 206 can thereafter receive geometry data 172 as a further input.

As discussed herein, IC modeling program 206, including statistical predictive model 174, can create new or adjusted proposed IC layouts 100 based on analysis of proposed IC layouts, vector libraries 180, and geometry data 172 about IC layout(s) 100. As described elsewhere herein statistical predictive model 174 can include multiple layers of models, calculations, etc., each including one or more adjustable calculations, logical determinations, etc., through any currently-known or later developed analytical technique for predicting an outcome based on raw data. Statistical predictive model 174 can therefore use geometry data 172, vector libraries 180, and/or various other data in VS 170 and/or memory 212 as an input to further adjust statistical predictive model 174 as discussed herein. Example processes executed with statistical predictive model 174 and/or IC modeling program 206 are discussed in detail elsewhere herein. Modules 222 of layout adjustment system 220 and modules 232 of layout prediction system 230 can implement one or more mathematical calculations and/or processes, e.g., to execute the machining learning and/or analysis functions of statistical predictive model 174.

Layout prediction system 230 can include a corresponding set of modules 232 for executing functions of IC modeling program 206, discussed herein. Modules 232 of layout prediction system 230 can include, e.g., a determinator for making logical determinations based on one or more inputs. Modules 232 of layout prediction system 230 can perform one or more actions relating to the training of statistical predictive model 174, e.g., submitting data from VS 170, IC layouts 100, and/or memory 212 to expand the amount of reference data used by statistical predictive model 174. Other functions of modules 232 can include, e.g., translating patterns 102 (FIG. 1) and/or usefulness maps along X-axis or Y-axis to create additional training data for statistical predictive model 174. Layout prediction system 230 can include modules 232 for "flagging" (e.g., marking, indexing, and/or otherwise identifying in data) various vector libraries 180 in VS 170, e.g., to indicate whether various vector libraries 180 correctly predicted mask deviations (or other violations) corresponding to expected (e.g., target) results (e.g., mask results) in a simulation, or actual mask deviations in manufactured circuits 160. Modules 232 of layout prediction system 230, in addition, can modify statistical predictive model 174 by adjusting variables, coefficients, weights threshold values, reference values, etc., based on various information in VS 170 and/or memory 212. Modules 232 of layout prediction system 230 can also include a calculator for carrying out various mathematical operations, e.g., to adjust statistical predictive model 174 as prescribed by other processes. In other embodiments, modules 232 of layout prediction system 230 may be used to adjust statistical predictive model 174.

In some particular embodiments, computer system 202 can be operatively connected to or otherwise in communication with manufacturing device 150 having one or more OPC-based and/or MPC-based manufacture tools, e.g., an OPC modeler, MPC modeler as part of the layout adjustment system 220 for converting proposed IC layouts 100 into instructions used by manufacturing device 150 to create manufactured circuit(s) 160. Computer system 202 can thus be embodied as a unitary device in a semiconductor manufacturing plant coupled to, manufacturing device 150 and/or other devices, or can be multiple devices each operatively connected together to form computer system 202. Embodiments of the present disclosure can thereby include using statistical predictive model 174 to predict (based on vector libraries 180) how predicted mask shapes will affect modeled circuits formed from proposed IC layouts 100 or manufactured circuits 160 formed from proposed IC layouts 100; determining whether the prediction is correct based on related data 172 for predicted mask adjustments 185 or manufactured circuits 160 formed using the adjusted masks; and thereafter flagging each proposed IC layout 100 (and corresponding adjustment) as being correctly or incorrectly predicted. In cases where proposed IC layout 100 is not correctly predicted, layout prediction system 230 can adjust statistical predictive model 174, e.g., based on the discrepancies between predicted and modeled (or, actual) shapes formed from masks (e.g., mask deviations). As discussed herein, embodiments of the present disclosure thereby provide machine learning processes for automatically adjusting statistical predictive model 174 and/or proposed IC layouts 100 to correctly identify the location of mask deviations in mask adjustments 185 and/or manufactured circuits 160 produced with those adjusted masks.

Where computer system 202 comprises multiple computing devices, each computing device may have only a portion of IC modeling program 206, layout adjustment system 220, and/or layout prediction system 230 fixed thereon (e.g., one or more modules 222, 232). However, it is understood that computer system 202 and layout adjustment system 220 are only representative of various possible equivalent computer systems that may perform a process described herein. Computer system 202 can obtain or provide data, such as data stored in memory 212 or storage system 214, using any solution. For example, computer system 202 can generate and/or be used to generate data from one or more data stores, receive data from another system, send data to another system, etc.

Operational Methodology

Figure 4:
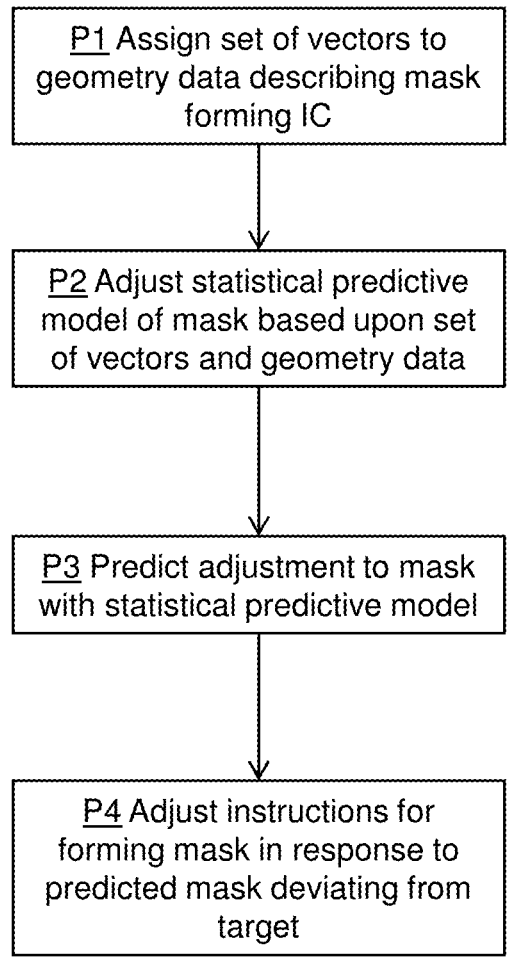
FIG. 4 is an example flow diagram of a method for mask process correction (MPC) according to embodiments of the disclosure.

Referring to FIG. 4, processes in an approach for mask process correction (MPC) are illustrated in a flow diagram. The processes depicted in FIG. 4 can be implemented, e.g., with one or more modules 222 of layout adjustment system 220, modules 232 of layout prediction system 230, statistical predictive model 174 and/or other components of computer system 202 described herein by example. A single and/or repeated execution of the processes discussed herein can yield a machine learning process for predicting mask deviations in modeled circuits or in manufactured circuits 160, and adjusting statistical predictive model 174, e.g., to account for discrepancies between predicted (simulated) mask results and target mask results. In this manner, circuit designers may adjust future proposed IC layouts 100 to account for the location of various mask deviations, and/or expand the amount of data in VS 170, as discussed herein. In the example processes discussed herein, proposed IC layout 100 will generally be described as including at least two patterns 102, 104 therein, with some alternative examples referring to proposed IC layouts with different numbers of patterns (e.g., one pattern, four patterns, ten patterns, etc.). It is also understood that the present disclosure can be implemented with respect to multiple proposed IC layouts 100 simultaneously and/or sequentially, with each proposed IC layout including patterns 102, 104 with any conceivable dimensions, in any conceivable number, etc., and that other examples are discussed herein where appropriate. The various processes discussed herein, furthermore, can be implemented before, after, or during OPC implementation on one or more proposed IC layouts 100 and/or manufactured circuits 160. It is also understood that one VS 170 can be used for multiple proposed IC layouts 100 in embodiments of the disclosure, that multiple VSs 170 and/or statistical predictive models 174 can be used for one proposed IC layout 100, and/or other embodiments may include further combinations of IC layouts 100, VSs 170, predictive models 174, etc.

Figure 5:
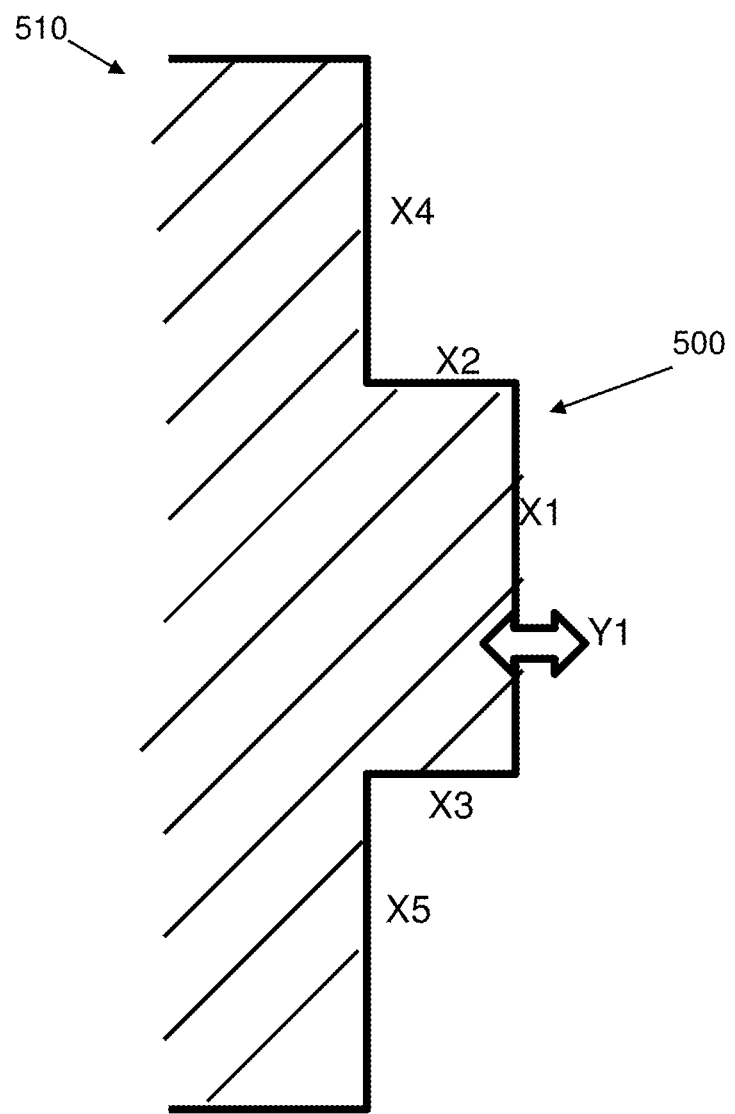
FIG. 5 is a schematic illustration of an example mask feature demonstrating a vectorization approach according to various particular embodiments of the disclosure.

As shown in FIG. 4, a method according to various embodiments can include:

Process P1: assign a set (e.g., one or more) of vectors to geometry data describing at least one mask for forming an integrated circuit (IC). In various embodiments, with continuing reference to FIGS. 1 and 3, this process can include assigning one or more vectors from vector library 180 to geometry data 172 describing at least one mask for forming an IC (e.g., according to IC layout 100). In some cases, this process includes searching vector library 180 for vector assignments relating to one or more geometric features of a given mask (or set of masks). For example, this process can include assigning a vector to each of a nearest four edges in each feature of the mask (e.g., each of a nearest four edges to an opening). The process of assigning a vector to edges (e.g., a nearest four edges of a feature) can be contrasted with the conventional process of pixelating. In contrast to pixelating, assigning vectors (or "vectorizing") involves treating each edge of a feature as a line of a certain length. The edge is described as a vector of values. For example, as shown in FIG. 5, feature 500 (center edge with length X1) can be assigned a vector value of {X1, X2, X3, X4, X5}. This characteristic vector is composed of the length of the feature 500 itself, and the lengths of the four adjacent edges (e.g., with their corresponding signs, as discussed with reference to FIG. 7). By constructing such a vector, the feature 500 (e.g., edge) can be effectively characterized. In these examples, the length of each edge can be calculated from the coordinate values of the ends of that edge, and the size of the vector will depend upon the complexity of the environment in which that edge resides (as well as its application). For example, as described herein with respect to FIG. 8, a vector for a particular feature (e.g., edge) can be composed of not only the lengths of four adjacent edges, but also the run length/space between edges. In this example, the vector value of an edge can be expanded to include additional elements, e.g., {X1, X2, X3, X4, X5, WW, WL, SW, SL}. This expanded vector definition can enhance prediction of mask processes when compared with vectors having less robust definitions. As described herein, geometry data 172 can be used to determine where mask shapes (e.g., a line opening shape) are located in space, and using that geometry data 172, VS 170 can apply a vector from vector library 180 to one or more data points from geometry data 172. In the above-noted example of an opening such as a line opening, VS 170 can assign a vector from vector library 180 to each of the edges of the feature and compensate based upon the assigned vector. In some particular examples, the set of vectors can describe a fragmentation condition or a segmentation condition in the at least one mask. Fragmentation/segmentation is a process used to divide a long feature (e.g., edge) into several smaller pieces (e.g., fragments or segments). As such, a fragment or segment can be treated as an edge. In the example depiction shown in FIG. 6, a vector can be assigned to a fragment/segment, with the vector including the length of that fragment/segment along with a length of adjacent fragment(s)/segment(s) {X1, X2, X3, X4, X5} (except in this example, X2=X4=0). In other example cases, the set of vectors includes a rule of sign for resolving conflict between conditions in the geometry data. In still other example implementations, the set of vectors describe at least one of a spacing between mask features and a width of mask features.

Process P2: adjust a statistical predictive model of the at least one mask based upon the set of vectors and the geometry data 172. As described herein, statistical predictive model 174 can include a statistical model configured to simulate the behavior of mask(s) (as geometry data 172 and/or data in IC layout 100) under particular processing conditions. After the process of assigning vectors to geometry data 172, layout prediction system 230 can adjust (and in some cases, build at least a portion of) statistical predictive model 174 for one or more masks based upon those assigned vectors. For example, after assigning a characteristic vector to a feature (e.g., an edge) such as the feature with length X1 (FIG. 5), statistical predictive model 174 is adjusted to predict a correction on that feature such that the correction amount approximates the ideal correction amount Y1 (FIG. 5). This ideal correction amount can be based upon empirical correction data relating to mask features. The statistical predictive model 174 can be built/adjusted by proposing an initial model, e.g., a multi-layer neural network with a set of parameters. A loss function can also be defined to describe a deviation between the model predicted correction (Y') and the ideal correction (Y) for the entire data set of the statistical predictive model 174. Statistically, when the model predicted correction (Y') approaches the ideal correction (Y), the loss function decreases. As such, the statistical predictive model 174 can be trained by tuning parameters to minimize the loss function (e.g., to increase prediction accuracy). As noted herein, the statistical predictive model 174 can be constructed using statistical variations and probabilities of particular outcomes based upon vector quantities, e.g., magnitude and/or direction. In some cases, the initially assigned vector is given a statistical likelihood of particular outcomes (e.g., particular mask deviations) from predicted geometries 198 and/or any empirical data. This statistical likelihood is codified in the statistical predictive model 174) to simulate the behavior of the mask during formation (e.g., during lithography) of an IC according to the IC layout 100.

Process P3: predict an adjustment to the at least one mask with the statistical predictive model. According to various embodiments, this process can be performed using statistical predictive model 174. In some particular implementations, layout prediction system 230 can utilize statistical predictive model 174 to predict one or more adjustments to the masks used to form an IC according to IC layout 100. This can include predicting lithography processes with statistical predictive model 174 to determine a likelihood that particular events (e.g., particular mask deviations) will occur during the predicted processes. The predicted mask features (e.g., coordinates) and adjustments to such features can be represented as a data model or output in a form such as predicted mask adjustment 185, and may be influenced by one or more manufacturing processes employing the at least one mask.

Process P4: adjust instructions for forming the at least one mask in response to a predicted mask result of the statistical predictive model 174 deviating from a target mask result (e.g., predicted geometries 198) for the at least one mask. In various embodiments, when the predicted mask result (e.g., from predicted mask adjustment 185) deviates from the target mask result (e.g., predicted geometries 198), layout adjustment system 220 can adjust IC layout 100 and/or geometry data 172 about the IC layout 100 to modify the mask(s) affected by the predicted mask result (predicted mask adjustment 185). In some examples, this can include comparing predicted geometries 198 with predicted mask adjustment 185 for one or more masking processes to determine whether the predicted mask result (predicted mask adjustment 185) varies from the target mask result (predicted geometries 198) for one or more manufacturing processes. In particular embodiments, the instructions for forming the mask(s) further include mask data correction instructions for modifying the geometry data 172 and/or the IC layout 100 based upon the predicted adjustment (from process P3).

In some particular implementations, for a given mask or set of masks, predicting the mask adjustment (process P3) is performed in a single run prior to adjusting the instructions (e.g., IC layout 100) for forming the at least one mask (process P4). That is, statistical predictive model 174 can be robust enough to accurately model the adjustment for the mask(s) such that an iterative simulation-adjustment-simulation-adjustment processes is not necessary. In this case, the statistical predictive model 174 may still be updated at a later time, or in a separate process, however, it need not be modified in order to re-simulate a manufacturing process and adjust the instructions for forming the mask (e.g., the geometry data 172 and/or the IC layout 100). This streamlined process can greatly increase the efficiency of modifying masking instructions.

Adjusting statistical predictive model 174 can include, e.g., adding patterns that are critical to new issues, or removing patterns that are not important and easy to cause data overfitting issues; increasing or decreasing the value of various coefficients, e.g., by retraining statistical predictive model 174 with the most recently updated form of VS 170, adjusting mathematical processes and/or models for relating attributes of proposed IC layout 100 to manufacturing sensitivities, changing the control logic and steps for analytically diagnosing particular patterns 102, 104 in proposed IC layout 100, etc. In any case, the amount and type of adjusting applied to statistical predictive model 174 can be related to the type of error, the amount of error, various attributes of actual deviation in the predicted mask from the target mask.

FIG. 5 shows a schematic depiction of an example feature (e.g., contour) 500 in a mask 510, and is referred to in conjunction with FIG. 1 and FIGS. 3 and 4. In this case, the edge (length X1) of feature 500 is described in vectorized coordinate terms as lengths X1, X2, X3, X4 and X5, and vector Y1 is a mask adjustment that should be applied to the edge having length X1 (as taken from vector library 180). In various embodiments, statistical predictive model 174 can predict a value (e.g., magnitude, direction) for adjustment vector Y1 based upon lengths X1, X2, X3, X4 and X5, and layout prediction system 230 can simulate the masking process for mask 510 (or specifically, feature 500) in order to detect whether the predicted masking process deviates from the target (modeled) value. In this example shown in FIG. 5, the edge with length X1 is the subject edge, and the nearest four (4) edges have lengths X2, X3, X4 and X5. The adjustment vector Y1 for the edge with length X1 is assigned to account for these nearest four edge lengths. In this case, a characteristic vector {X1, X2, X3, X4, X5} is formed to describe the edge with length X1, and adjustment vector Y1 represents the adjustment value for that edge. In this example, {X1, X2, X3, X4, X5}→model→Y1 can be used to train the predictive model. It is understood that while a nearest four (4) edges approach is described in this example, it is understood that various additional parameters (e.g., numbers of edges) could be considered in vector calculation, e.g., a greater or lesser number of nearest edges.

Figure 6:
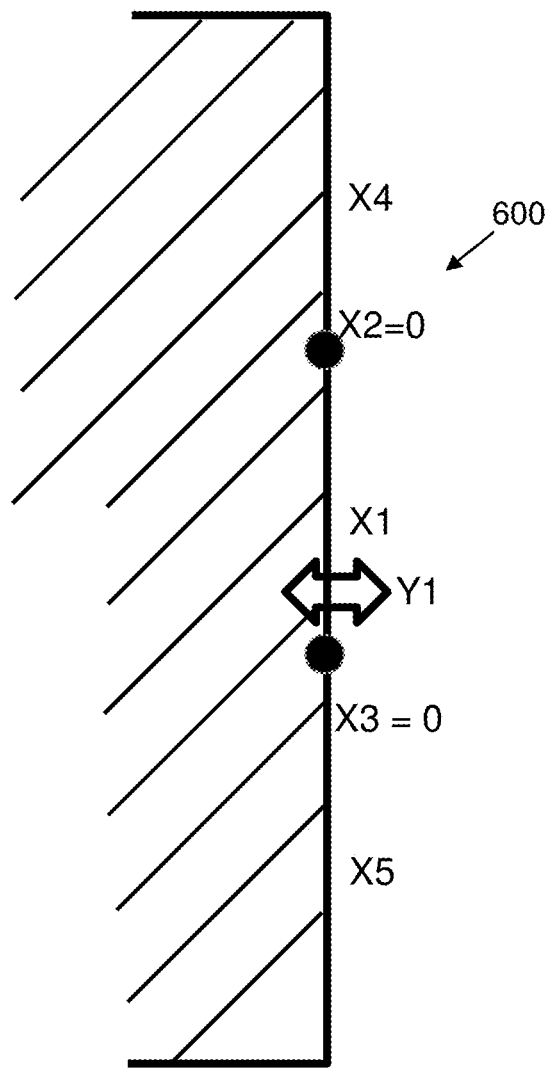
FIG. 6 is a schematic illustration of an example mask feature demonstrating a vectorization approach according to various embodiments of the disclosure.

FIG. 6 shows an example schematic depiction of a mask feature 600 illustrating a post-segmentation condition (e.g., a fragmentation condition or a segmentation condition). In these embodiments, as described herein, a post-segmentation condition can be presented with zeroed values for particular coordinates, e.g., X2=0 or X3=0 for vector Y1.

Figure 7:
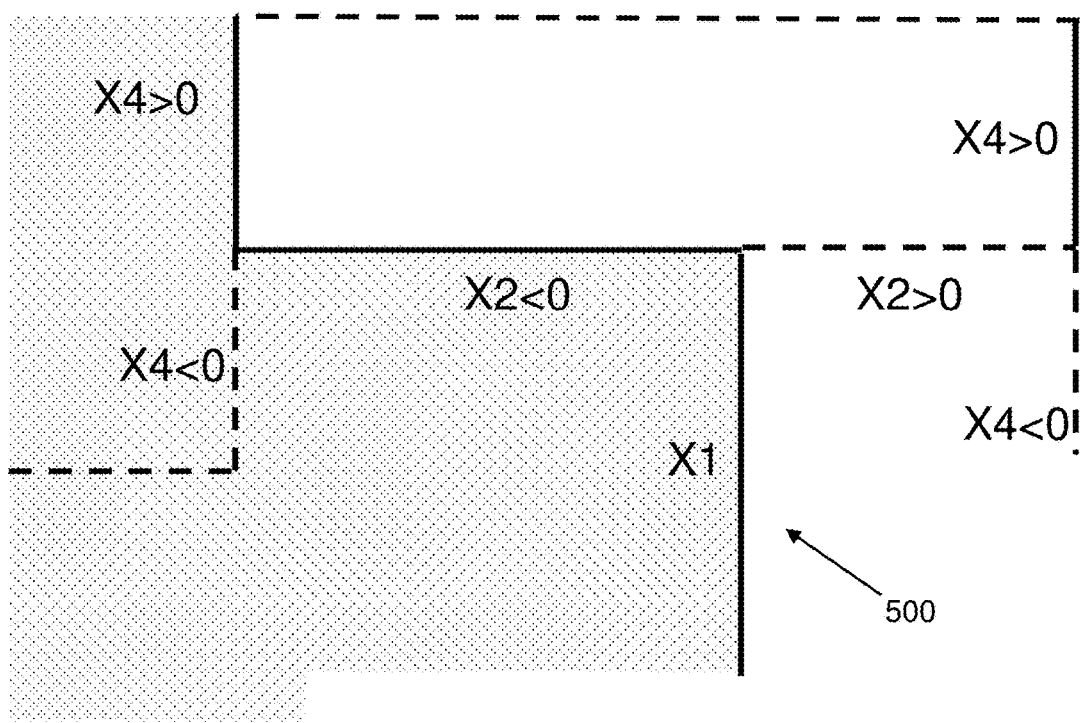
FIG. 7 is a schematic illustration of an example mask feature demonstrating a vectorization approach according to various additional embodiments of the disclosure.

FIG. 7 shows an example close-up schematic depiction of mask feature 500 (FIG. 5), illustrating a method of vectorizing such a feature 500 using a rule of sign approach for resolving conflict between conditions in the geometry data 172 (FIG. 1, FIG. 3). In these approaches, different conditions of the mask feature 500 can be distinguished using a sign-based approach, whereby edges are weighted using positive/negative values from a reference measurement. For example, with respect to edge X1, a vector's direction (or, sign) could be determined based upon the difference between sets of neighboring edges. In the illustration of FIG. 7, X2/X4 is compared with X3/X5 (FIG. 5) to determine the respective signs of these vectors.

Figure 8:
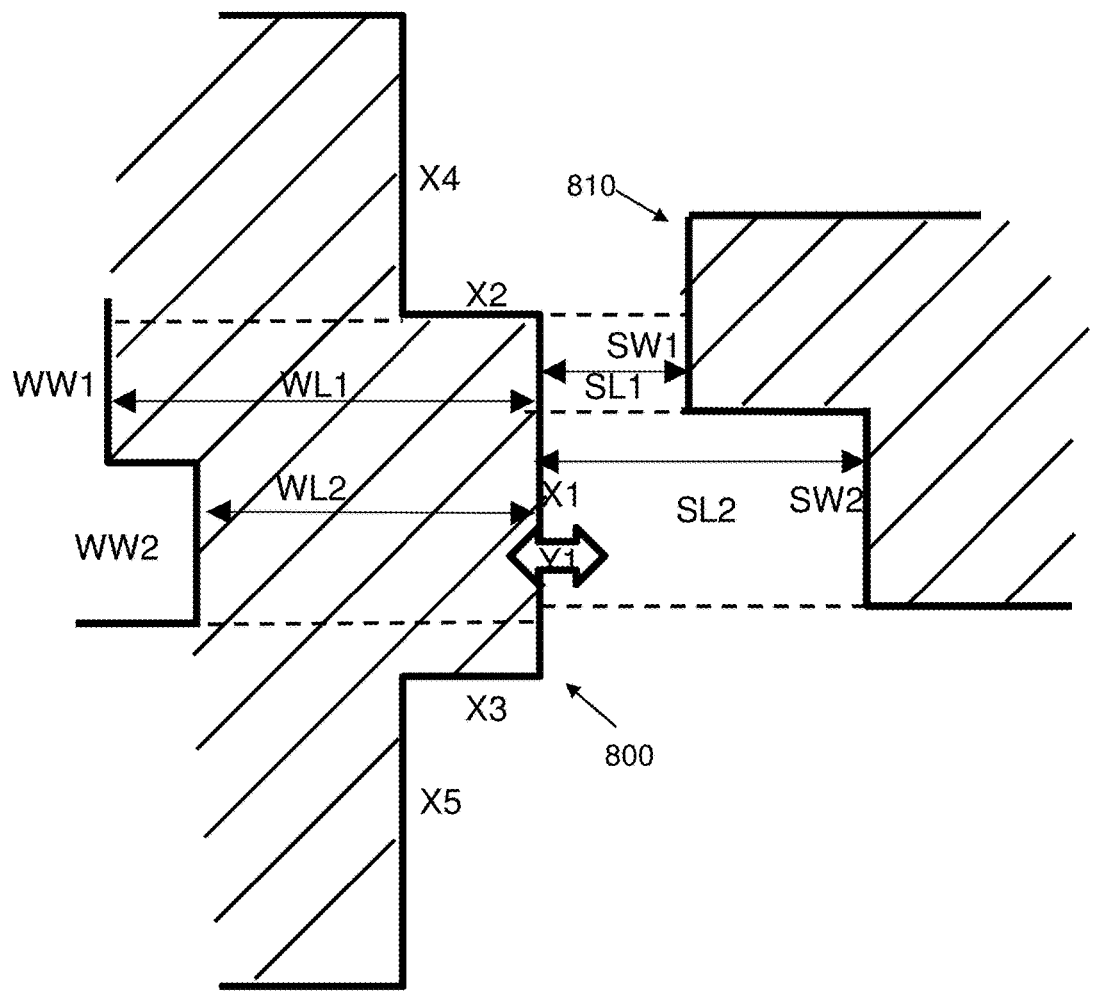
FIG. 8 is a schematic illustration of an example mask feature demonstrating a vectorization approach according to various embodiments of the disclosure.

FIG. 8 shows another schematic depiction of example mask features 800, 810, illustrating a method of vectorizing such features 800, 810 to account for a spacing (e.g., SL1, SL2) or a width (WL1, WL2) of mask feature 800. In various embodiments, such features 800, 810 are vectorized using their effective running length and effective spacing to simplify input features, (e.g., naming Sxx, Wxx) with a calibration target (e.g., 1 micron). For example, in some cases, the running length and spacing between features can aid the statistical predictive model 174 in predicting mask adjustments. However, as illustrated in FIG. 8, the running length and/or spacing of a feature can be complicated to describe. In these cases, an effective running length and effective spacing can be used, whereby $SW_i$ is the $i^{th}$ projecting edge segment from adjacent polygons, while $SL_i$ is the spacing between X1 and $SW_i$. So, SW=Sum($SW_i$) is the effective running length of projecting edges, and SL=Sum($SL_i * SW_i$)/SW is the effective spacing of the total run length.

Figure 9:
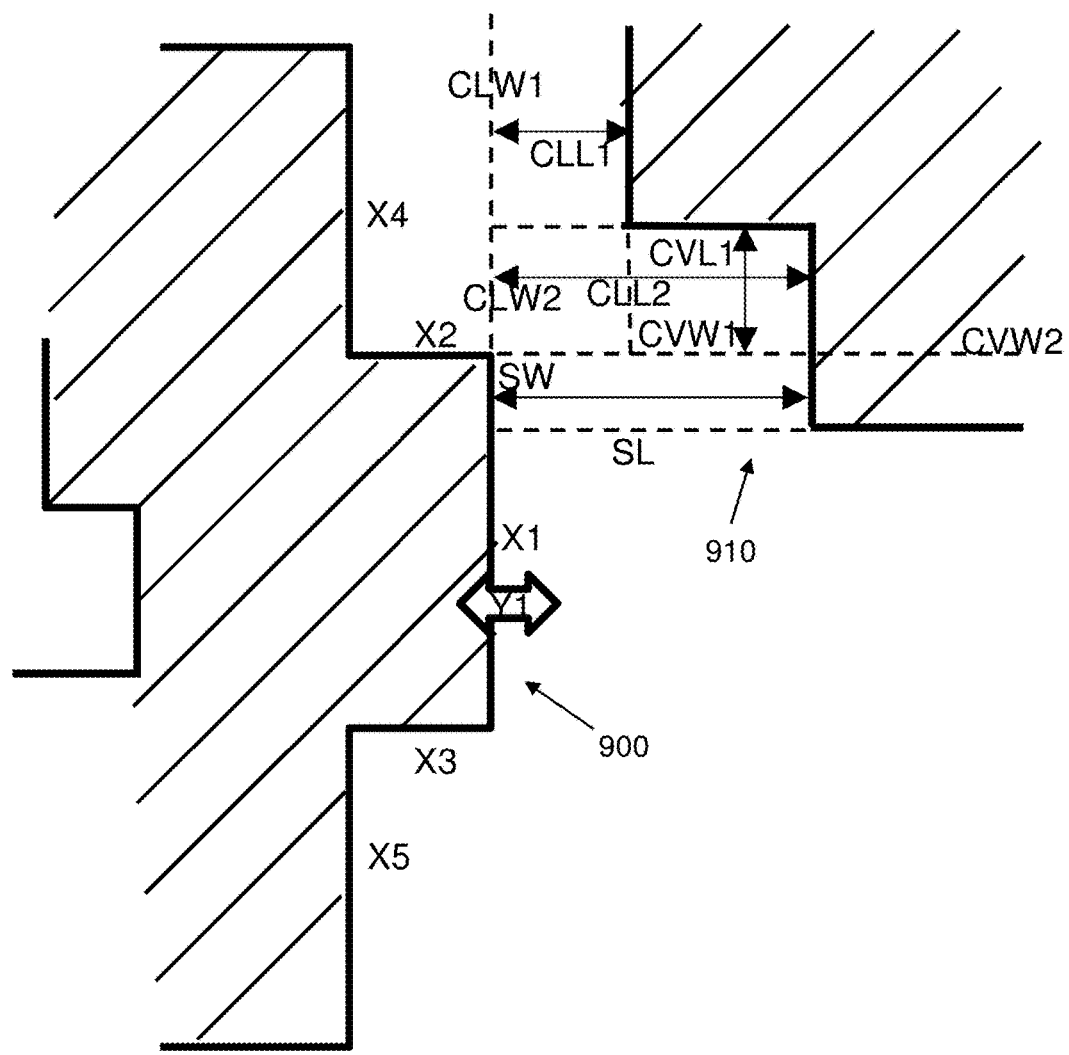
FIG. 9 is a schematic illustration of an example mask feature demonstrating a vectorization approach according to various particular embodiments of the disclosure.

FIG. 9 shows another schematic depiction of example mask features 900, 910, illustrating a method of vectorizing such features 900, 910 to account for convex corner-to-corner conditions. That is, in various embodiments, vectorizing approaches can include setting vertical and lateral reference lines with a certain length (e.g., x microns) at the left side of a feature edge (e.g., left side of X1 edge). In this approach, for each corner: CLW is the effective running length of the lateral dimension; CLL is the effective projecting length of the lateral dimension; CVW is the effective running length of the vertical dimension; and CVL is the effective projecting length of the vertical dimension. In this example, CVL2=0 when its nearest edge crosses the reference line extending from edge X2.

Figure 10:
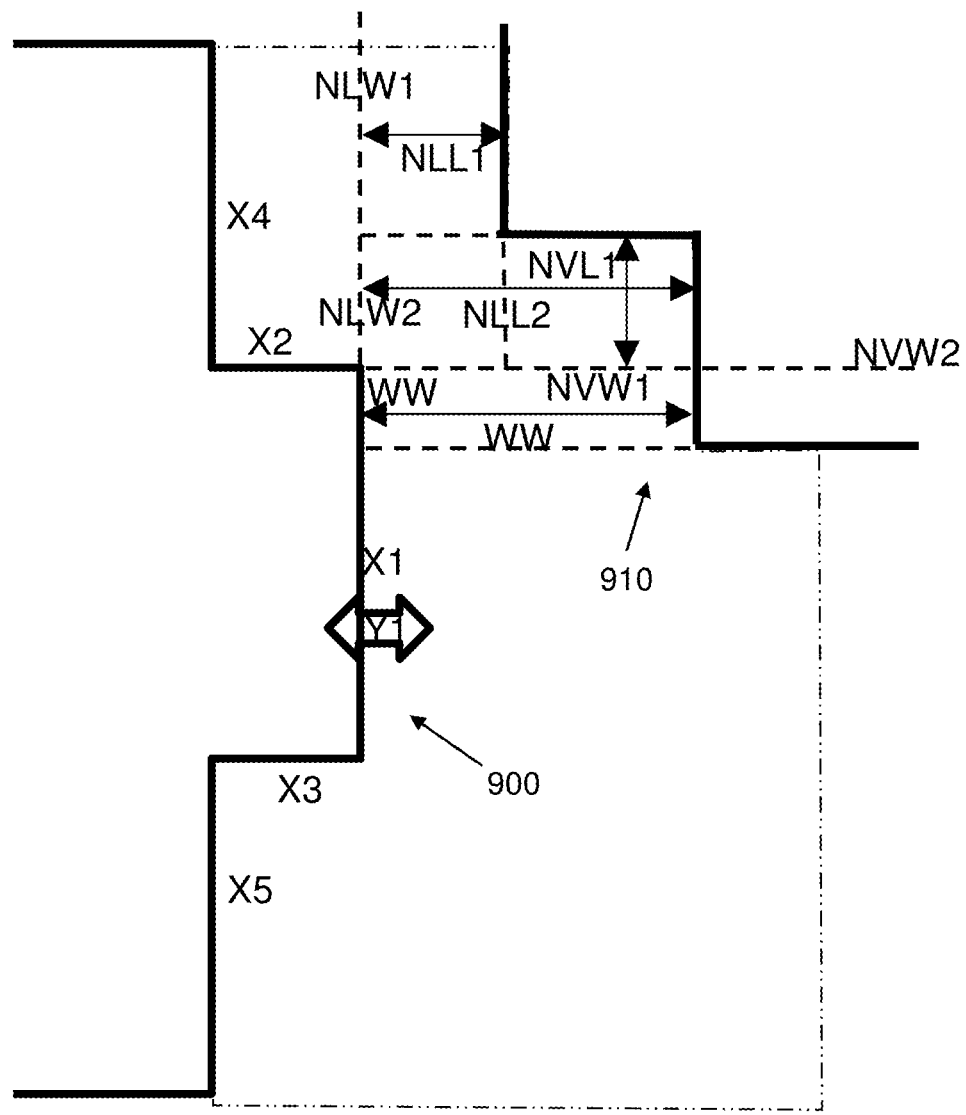
FIG. 10 is a schematic illustration of an example mask feature demonstrating a vectorization approach according to various additional embodiments of the disclosure.

FIG. 10 shows another schematic depiction of example mask features 900, 910 of FIG. 9, illustrating a method of vectorizing such features 900, 910 to account for concave corner-to-corner conditions. That is, in various embodiments, vectorizing approaches can include setting vertical and lateral reference lines with a certain length (e.g., x microns) at the left side of a feature edge (e.g., left side of X1 edge). In this approach, for each corner: NLW is the effective running length of the lateral dimension; NLL is the effective projecting length of the lateral dimension; NVW is the effective running length of the vertical dimension; and NVL is the effective projecting length of the vertical dimension. In this example, NVL2=0 when its nearest edge crosses the reference line extending from edge X2.

Figure 11:
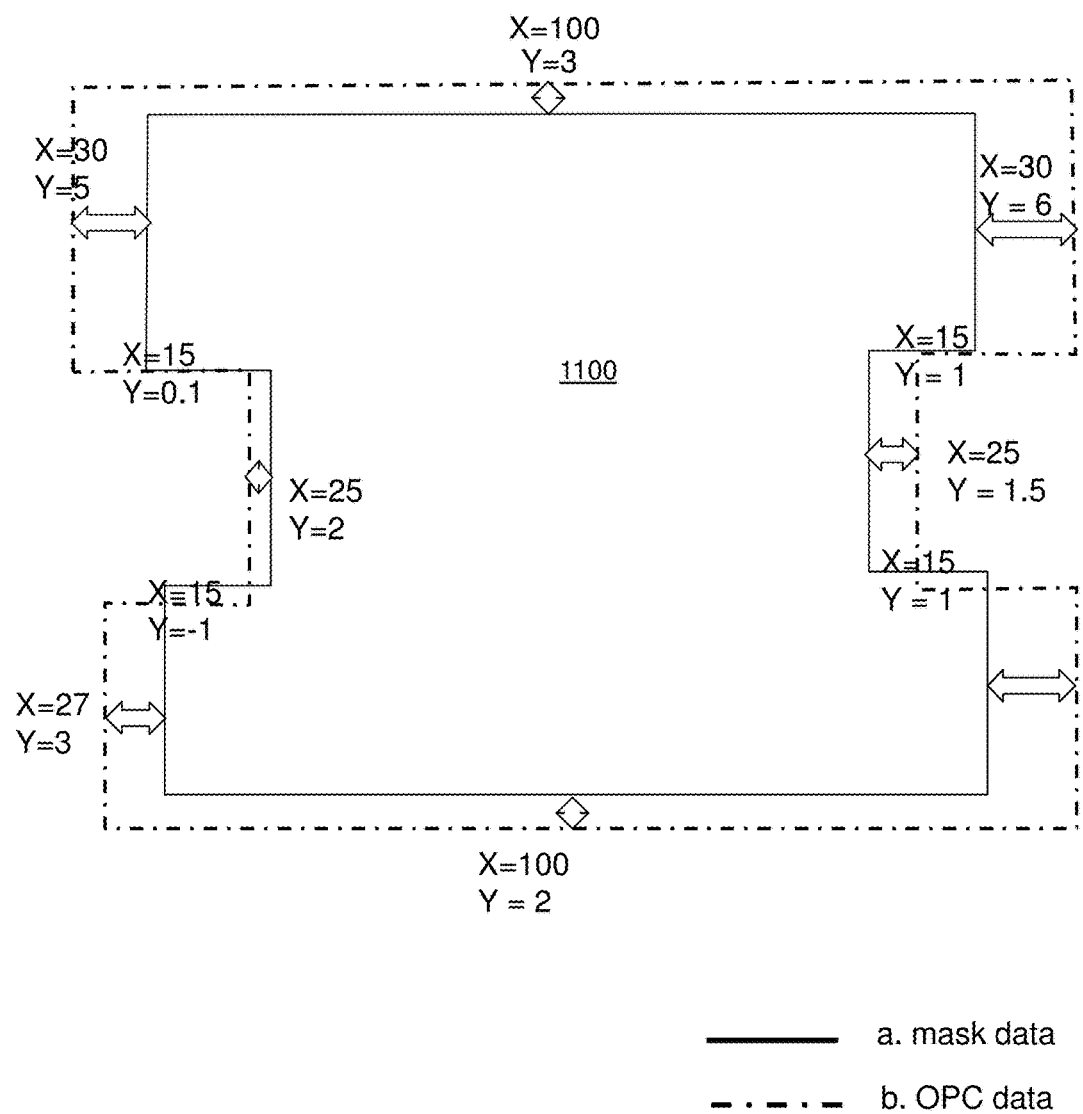
FIG. 11 is an example depiction of a mask and an optical proximity correction adjustment, illustrating a mask model feature extraction process according to various embodiments.

FIG. 11 shows an example depiction of a mask 1100, illustrating a mask model feature extraction process according to various embodiments. As shown, mask data (solid lines) is compared with OPC data (dashed lines) to extract edge information (X1-X9) from that OPC data as an input feature to the statistical predictive model 174 (e.g., FIGS. 1-3). The adjustment data (Y1-Y) can represent the output of statistical predictive model 174 after predicting the masking process according to various embodiments described herein. In this example, the statistical predictive model 174 is configured to predict mask adjustments based upon OPC data (shown in dashed lines), so that after applying adjustments to the OPC data, the desired mask data (shown in solid lines) can be reached. As noted herein, a characteristic vector containing environmental information can be assigned to each feature (e.g., edge) on the mask. During the model building/adjusting phase, the mask data (shown in solid lines) is available, making the required (or, ideal) adjustment known for each feature (e.g., edge). This characteristic vector and its corresponding adjustment (e.g., predicted mask adjustment 185) can be used as an input to the statistical predictive model 174 in order to train that model in predicting the adjustment for each feature (e.g., edge) in the mask.

As noted herein, returning to FIG. 3, layout adjustment program 220 can adjust one or more mask shapes in proposed IC layout 100 to adjust the size, shape, position, etc., of patterns 102, 104 to reduce or remove variously identified mask deviations in proposed IC layout 100. To this extent, modules 222 of layout adjustment program 220 can adjust various patterns 102, 104 in proposed IC layout 100, e.g., by adjusting a corresponding mask shape in proposed IC layout 100 to affect related patterns 102, 104. Adjusting one or more masks can thus adjust a pattern width, separation distance, pattern density, inter-layer size, etc., to mitigate the effects of processing variation on proposed IC layout 100 during manufacture.

Embodiments of the disclosure can optionally include inputting the adjusted form of proposed IC layouts 100 to VS 170, e.g., to further train statistical predictive model 174 to calculate processing constraints for new IC layouts 100 and/or better predict the presence of mask deviations (e.g., mask defects) in patterns 102, 104 thereof.

Alternative Embodiments and Implementations

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the present invention may take the form of a computer program product embodied in one or more computer readable medium(s) having computer readable program code embodied thereon.

Any combination of one or more computer readable medium(s) may be used. A computer readable storage medium may be, for example, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the Figures illustrate the layout, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As used herein, the term "configured," "configured to" and/or "configured for" can refer to specific-purpose patterns of the component so described. For example, a system or device configured to perform a function can include a computer system or computing device programmed or otherwise modified to perform that specific function. In other cases, program code stored on a computer-readable medium (e.g., storage medium), can be configured to cause at least one computing device to perform functions when that program code is executed on that computing device. In these cases, the arrangement of the program code triggers specific functions in the computing device upon execution. In other examples, a device configured to interact with and/or act upon other components can be specifically shaped and/or designed to effectively interact with and/or act upon those components. In some such circumstances, the device is configured to interact with another component because at least a portion of its shape complements at least a portion of the shape of that other component. In some circumstances, at least a portion of the device is sized to interact with at least a portion of that other component. The physical relationship (e.g., complementary, size-coincident, etc.) between the device and the other component can aid in performing a function, for example, displacement of one or more of the device or other component, engagement of one or more of the device or other component, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method comprising:
    assigning a set of vectors to geometry data describing at least one mask for forming an integrated circuit (IC), wherein assigning the set of vectors to the geometry data includes assigning a vector to each edge of the at least one mask, the vector including edge information for a plurality of nearest edges in the at least one mask;
    adjusting a statistical predictive model of the at least one mask based upon the set of vectors and the geometry data;
    predicting an adjustment to the at least one mask with the statistical predictive model; and
    adjusting instructions for forming the at least one mask in response to a predicted mask result of the statistical predictive model deviating from a target mask result for the at least one mask.

2. The computer-implemented method of claim 1, wherein predicting the adjustment to the at least one mask is performed in a single run prior to adjusting the instructions for forming the at least one mask.

3. The computer-implemented method of claim 1, wherein the instructions for forming the at least one mask further include mask data correction instructions for modifying the geometry data based on the predicted adjustment.

4. The computer-implemented method of claim 1, wherein the set of vectors describe a fragmentation condition or a segmentation condition in the at least one mask.

5. The computer-implemented method of claim 1, wherein the set of vectors include a rule of sign for resolving a conflict between conditions in the geometry data.

6. The computer-implemented method of claim 1, wherein the set of vectors describe at least one of: a spacing between mask features and a width of mask features.

7. A computer program product comprising program code stored on a computer readable storage medium, which when executed by at least one computing device, causes the at least one computing device to perform actions including:
    assigning a set of vectors to geometry data describing at least one mask for forming an integrated circuit (IC), wherein the set of vectors includes a rule of sign for resolving a conflict between conditions in the geometry data;
    adjusting a statistical predictive model of the at least one mask based upon the set of vectors and the geometry data;
    predicting an adjustment to the at least one mask with the statistical predictive model; and
    adjusting instructions for forming the at least one mask in response to a predicted mask result of the statistical predictive model deviating from a target mask result for the at least one mask.

8. The computer program product of claim 7, wherein predicting the adjustment to the at least one mask is performed in a single run prior to adjusting the instructions for forming the at least one mask.

9. The computer program product of claim 7, wherein the instructions for forming the at least one mask further include mask data correction instructions for modifying the geometry data based on the predicted adjustment.

10. The computer program product of claim 7, wherein assigning the set of vectors to the geometry data includes assigning a vector to each edge of the at least one mask, the vector including edge information for a plurality of nearest edges in the at least one mask.

11. The computer program product of claim 7, wherein the set of vectors describe a fragmentation condition or a segmentation condition in the at least one mask.

12. The computer program product of claim 7, wherein the set of vectors describe at least one of: a spacing between mask features and a width of mask features.

13. A system comprising:
    at least one computing device configured to perform actions including:
        assigning a set of vectors to geometry data describing at least one mask for forming an integrated circuit (IC),
        wherein assigning the set of vectors to the geometry data includes assigning a vector to each edge of the at least one mask, the vector including edge information for a plurality of nearest edges in the at least one mask;
        adjusting a statistical predictive model of the at least one mask based upon the set of vectors and the geometry data;
        predicting an adjustment to the at least one mask with the statistical predictive model; and
        adjusting instructions for forming the at least one mask in response to a predicted mask result of the statistical predictive model deviating from a target mask result for the at least one mask.

14. The system of claim 13, wherein predicting the adjustment to the at least one mask is performed in a single run prior to adjusting the instructions for forming the at least one mask.

15. The system of claim 13, wherein the instructions for forming the at least one mask further include mask data correction instructions for modifying the geometry data based on the predicted adjustment.

16. The system of claim 13, wherein the set of vectors describe at least one of: a fragmentation condition in the at least one mask, a segmentation condition in the at least one mask, a spacing between mask features and a width of mask features.

17. The system of claim 13, wherein the set of vectors include a rule of sign for resolving a conflict between conditions in the geometry data.

* * * * *